United States Patent
Kuon et al.

(10) Patent No.: US 10,825,837 B2
(45) Date of Patent: Nov. 3, 2020

(54) SUBSTRATE PROCESSING APPARATUS AND DISPLAY DEVICE USING THE SAME

(71) Applicant: LG DISPLAY CO., LTD., Seoul (KR)

(72) Inventors: Ik Hyun Kuon, Gyeongsangbuk-do (KR); Jeong Kweon Park, Paju-si (KR); Ju Ik Hong, Gumi-si (KR); Jangcheol Kim, Paju-si (KR); Jinwook Kwak, Busan (KR)

(73) Assignee: LG DISPLAY CO., LTD., Seoul (KR)

( * ) Notice: Subject to any disclaimer, the term of this patent is extended or adjusted under 35 U.S.C. 154(b) by 189 days.

(21) Appl. No.: 15/674,288

(22) Filed: Aug. 10, 2017

(65) Prior Publication Data

US 2018/0097018 A1 Apr. 5, 2018

(30) Foreign Application Priority Data

Sep. 30, 2016 (KR) .................. 10-2016-0126589

(51) Int. Cl.
| | |
|---|---|
| *B24D 5/00* | (2006.01) |
| *H01L 27/12* | (2006.01) |
| *H01L 21/67* | (2006.01) |
| *B24B 9/08* | (2006.01) |
| *H01L 27/32* | (2006.01) |
| *H01L 51/00* | (2006.01) |

(52) U.S. Cl.
CPC ............ *H01L 27/1218* (2013.01); *B24D 5/00* (2013.01); *H01L 21/67092* (2013.01); *H01L 27/1262* (2013.01); *B24B 9/08* (2013.01); *B24D 2203/00* (2013.01); *H01L 27/3244* (2013.01); *H01L 51/0096* (2013.01)

(58) Field of Classification Search
CPC ....................................... B24D 5/00
USPC ..................... 451/44, 43, 541, 547
See application file for complete search history.

(56) References Cited

U.S. PATENT DOCUMENTS 4,344,260 A * 8/1982 Ogiwara ................. B24B 9/065
148/33
4,800,686 A 1/1989 Hirabayashi et al.
(Continued)

FOREIGN PATENT DOCUMENTS

| CN | 202575410 U | 12/2012 |
|---|---|---|
| JP | S62-241841 A | 10/1987 |

(Continued)

OTHER PUBLICATIONS

First Notification of Office Action, dated Feb. 2, 2019, for corresponding Chinese Application No. 201710692744.8, 20 pages. (With English Translation).

*Primary Examiner* — George B Nguyen
(74) *Attorney, Agent, or Firm* — Seed IP Law Group LLP

(57) ABSTRACT

Various embodiments provide a substrate processing apparatus for grinding a substrate, and a display device including a substrate in which a hole is formed in an edge of the substrate using the substrate processing apparatus. The substrate processing apparatus for processing a display substrate includes a body which, in operation, rotates, a cylindrical grinding part connected to the body, and a lateral groove formed in a surface of the cylindrical grinding part. The lateral groove is configured to accommodate the display substrate. Thus, it is possible to form a hole by grinding an edge of the display substrate so as to be matched with a designed value.

9 Claims, 8 Drawing Sheets

(56) References Cited

U.S. PATENT DOCUMENTS

| | | | | |
|---|---|---|---|---|
| 5,279,992 A * | 1/1994 | Maejima | ............ | B24D 5/02 |
| | | | | 257/E21.237 |
| 5,658,189 A * | 8/1997 | Kagamida | ............ | B24B 9/065 |
| | | | | 451/194 |
| 5,727,990 A * | 3/1998 | Hasegawa | ............ | B24B 9/065 |
| | | | | 451/221 |
| 8,398,464 B2 * | 3/2013 | Kim | ............ | B24B 9/065 |
| | | | | 451/285 |
| 8,721,392 B2 * | 5/2014 | Brown | ............ | B24B 9/102 |
| | | | | 451/44 |

FOREIGN PATENT DOCUMENTS

| | | |
|---|---|---|
| JP | 2013-198974 A | 10/2013 |
| JP | 5400518 B2 | 1/2014 |

\* cited by examiner

SUBSTRATE PROCESSING APPARATUS AND DISPLAY DEVICE USING THE SAME

CROSS-REFERENCE TO RELATED APPLICATIONS

This application claims the priority of Korean Patent Application No. 10-2016-0126589 filed on Sep. 30, 2016, in the Korean Intellectual Property Office, the disclosure of which is incorporated herein by reference.

BACKGROUND

Technical Field

The present disclosure relates to a substrate processing apparatus and a display device using the same and more particularly, to a substrate processing apparatus for forming a hole in an edge of a substrate and a display device using the same.

Description of the Related Art

As the world reached a full-scale information age, the field of display device for visually displaying electrical information signals has grown rapidly. Accordingly, the development of various flat display devices or flexible display devices with performance in terms of thinning, weight lightening, and low power consumption has been continuously researched. Representative examples of the flat display devices include a liquid crystal display device (LCD), a plasma display panel device (PDP), a field emission display device (FED), an electro-wetting display device (EWD), and an organic light emitting display device (OLED).

Such various display devices have employed various functions, such as a call function, a music playing function, and a photographing function, in addition to a display function for the convenience of users. In order for a display device to employ various functions, the display device should include various function modules therein. Also, since the display device includes various function modules therein, the weight and the thickness of the display device increase. Therefore, a technology for weight lightening and thinning of the display device is desired.

BRIEF SUMMARY

In order for a display device to include various function modules therein or in order to install an input button for operating a display device outside the display device, a process of forming a hole in an edge of a substrate constituting a panel may be used. In order to form the hole in the substrate, a substrate processing apparatus formed of a material and having a shape capable of grinding the edge or periphery of the substrate may be used.

In order to include the module devices or install the input button, the hole should have a position and a size with almost no margins with respect to the sizes of the module devices since a bezel size of the display device is gradually decreased. Also, since the hole size is increased but the bezel size is decreased, a margin of the grinding apparatus is gradually decreased.

Accordingly, the inventors of the present disclosure recognized the above-described problems and created a substrate processing apparatus for forming a hole in an edge or a periphery of a substrate so as to be matched with a designed value or size.

In one embodiment, a substrate processing apparatus for forming a hole in an edge or a periphery of a substrate so as to be matched with a designed value or size is provided.

In one embodiment, a display device including a module device or an input device in a hole formed using a substrate processing apparatus is provided.

The aspects of the present disclosure are not limited to the aforementioned objects, and other objects, which are not mentioned above, will be apparent to a person having ordinary skill in the art from the following description.

According to an embodiment of the present disclosure, there is provided an apparatus for processing a substrate, comprising a body which, in operation, rotates, a cylindrical grinding part connected to the body, and a lateral groove located in a surface of the cylindrical grinding part, the lateral groove accommodating the display substrate for processing thereof. Thus, it is possible to reduce interference between the substrate processing apparatus and a substrate in which a hole is not formed. Also, it is possible to reduce a reduction of lifetime of the substrate processing apparatus caused by abrasion of the lateral groove.

According to an embodiment of the present disclosure, there is provided a substrate processing apparatus for forming a hole at a periphery of a substrate, comprising a body coupled to a rotating motor, and a grinding part coupled to the body, the grinding part including a lateral groove along a lateral surface of the grinding part, the lateral groove including two surfaces in a cutting plane positioned along a rotation axis of the grinding part. Thus, it is possible to form a hole by grinding the periphery of the substrate so as to be matched with a designed value.

According to an embodiment of the present disclosure, there is provided a display device including a first substrate, a second substrate on the first substrate, and an opening disposed in a periphery of the first substrate. The opening is exposed by the second substrate. The opening has a configuration resulting from a cylindrical grinding apparatus having a lateral groove. Thus, it is possible to provide a thin display device with a reduced bezel size by installing a module or an input button in the ground opening.

Details of other embodiments will be included in the detailed description of the disclosure and the accompanying drawings.

According to an embodiment of the present disclosure, a substrate processing apparatus includes a grinding part and a lateral groove formed along a lateral surface of the grinding part. Thus, it is possible to form a hole by grinding an edge or a periphery of a substrate so as to be matched with a designed value or size.

In addition, according to an embodiment of the present disclosure, a substrate processing apparatus includes a plurality of lateral grooves. Thus, it is possible to extend a lifetime of the substrate processing apparatus and thus possible to reduce processing time and cost.

In addition, according to an embodiment of the present disclosure, a lateral groove of a grinding part for forming a hole in an edge or a periphery of the substrate is formed at a predetermined angle. Thus, it is possible to reduce interference between the substrate processing apparatus and the substrate in which the hole is not formed. Also, it is possible to reduce a reduction of lifetime of the substrate processing apparatus caused by abrasion of the lateral groove.

In addition, according to an embodiment of the present disclosure, a shortest distance from a hole formed in an edge or a periphery of a substrate to a substrate in which the hole is not formed is greater than a depth of a lateral groove of a grinding apparatus. Thus, it is possible to form the hole by grinding the substrate to the depths of the substrate without interference between the grinding apparatus and the substrate. Therefore, it is possible to reduce a bezel size of a display device and also possible to form the hole deep inside the substrate.

In addition, according to an embodiment of the present disclosure, a lateral groove is formed to have a high angle. Thus, a depth of the lateral groove can be reduced and a margin of the shortest distance between the hole and the substrate in which the hole is not formed can be secured. Therefore, it is possible to reduce interference between the grinding part and the substrate.

In addition, according to an embodiment of the present disclosure, a corner of a hole formed in an edge or a periphery of a substrate is ground into a round shape with the grinding apparatus. Thus, the substrate can absorb impacts which may be generated during a process. Therefore, it is possible to reduce the generation of grooves caused by separation of fragments of the substrate from the corner of the hole.

In addition, according to an embodiment of the present disclosure, a lateral groove is formed to have a high angle. Thus, a margin from the grinding part to the substrate can be secured. Therefore, it is to form a hole deep inside the substrate and also possible to provide a display device with a narrow bezel.

The objects to be achieved by the present disclosure, the aspects, and the effects of the present disclosure described above do not specify essential features of the claims, and, thus, the scope of the claims is not limited to the disclosure of the present disclosure.

BRIEF DESCRIPTION OF THE SEVERAL VIEWS OF THE DRAWINGS

The accompanying drawings, which are included to provide a further understanding of the disclosure and are incorporated and constitute a part of this application, illustrate embodiments of the disclosure and together with the description serve to explain various principles. In the drawings.

DETAILED DESCRIPTION

Figure 1:
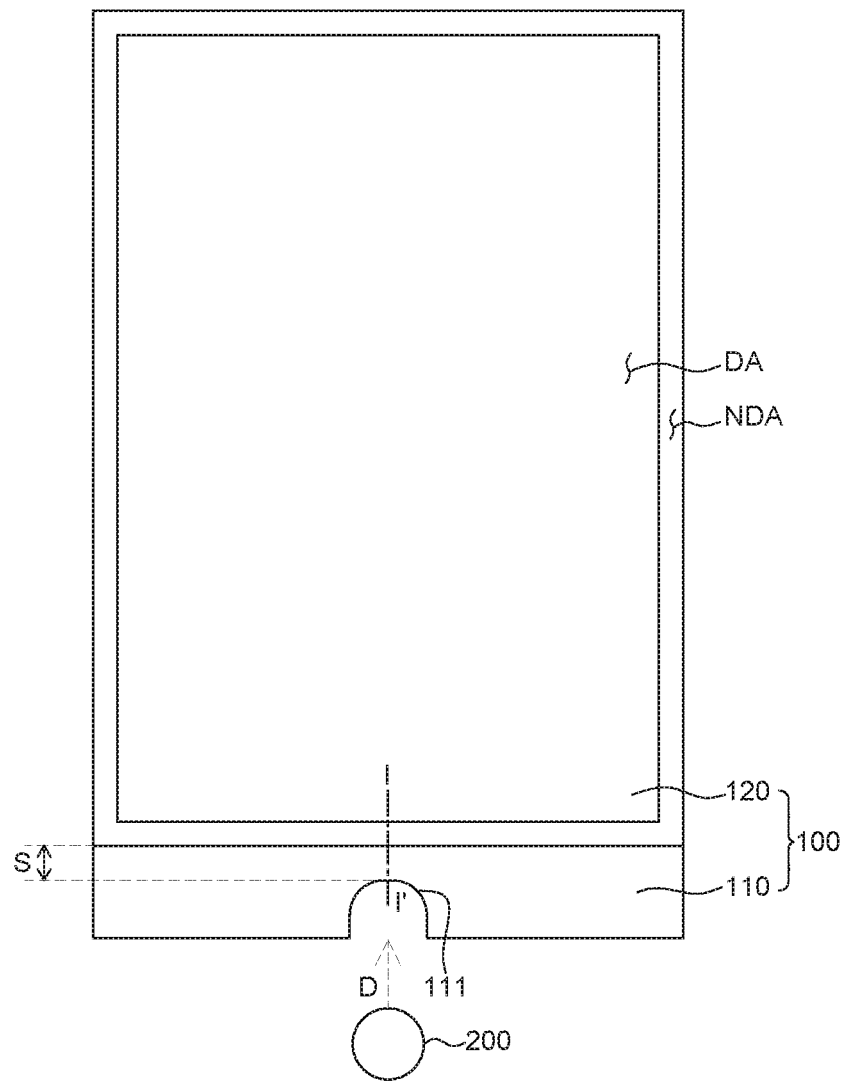
FIG. 1 is a diagram illustrating an embodiment of a panel provided by a substrate processing method according to an embodiment of the present disclosure.

Advantages and features of the present disclosure, and methods for accomplishing the same will be more clearly understood from embodiments described below with reference to the accompanying drawings. However, the present disclosure is not limited to the following embodiments but may be implemented in various different forms. The embodiments are provided to complete disclosure of the present disclosure and to fully provide a person having ordinary skill in the art to which the present disclosure pertains with the category of the disclosure, and the present disclosure will be defined by the appended claims.

The shapes, sizes, ratios, angles, numbers, and the like shown in the accompanying drawings for describing the embodiments of the present disclosure are merely examples, and the present disclosure is not limited thereto. Like reference numerals generally denote like elements throughout the present specification. Further, in the following description, a detailed explanation of well-known related technologies may be omitted to avoid unnecessarily obscuring the subject matter of the present disclosure. The terms such as "including," "having," and "comprising" used herein are generally intended to allow other components to be added to any recited components unless the terms are used with the term "only." Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly." Further, the two parts may be positioned lateral to each other.

When the time sequence between two or more incidents is described using the terms such as "after," "subsequent to," "next to," and "before," two or more incidents may be inconsecutive unless the terms are used with the term "immediately" or "directly."

Although the terms "first," "second," and the like are used for describing various components, these components are not confined by these terms. These terms are merely used for distinguishing one component from the other components. Therefore, a first component to be mentioned below may be a second component in a technical concept of the present disclosure.

The features of various embodiments of the present disclosure can be partially or entirely bonded to or combined with each other and can be interlocked and operated in technically various ways, and the embodiments can be carried out independently of or in association with each other.

Hereinafter, an organic light emitting display device according to embodiments of the present disclosure will be described with reference to the accompanying drawings.

FIG. 1 is a diagram illustrating an embodiment of a panel provided by a substrate processing method according to an embodiment of the present disclosure.

A panel 100 including a first substrate 110 in which a hole 111 is formed may be a display substrate which can be used in various display devices, such as a liquid crystal display device, a field emission display device, an electrophoretic display device, an electro-wetting display device, and an organic light emitting display device. The hole 111 may also be referred to as a recess, a groove, or an opening. And, the panel 100 according to the embodiments of the present disclosure may be applied to display devices including a TV, a mobile device, a tablet PC, a monitor, a laptop computer, and a display device for vehicle. The panel 100 may also be applied to wearable display devices, foldable display devices, and rollable display devices.

There may be one or two substrates constituting the panel 100. If there are two substrates constituting the panel 100, the panel 100 includes a first substrate and a second substrate. The first substrate may be a transistor substrate in which a driving element that drives a pixel is disposed. The second substrate may include various films for forming a color filter substrate that displays a color of a pixel, an encapsulation substrate for display, a cover substrate, and/or a touch substrate. And, each of the first substrate 110 and a second substrate 120 may be a cover substrate and/or a touch substrate, and a display panel.

The first substrate 110 may be a substrate formed of a material, such as glass, which can be ground by diamond or diamond-like material. The second substrate 120 may be formed of an insulating material. For example, the second substrate 120 may be formed as a flexible film of glass, polyimide, acryl, polyacrylate, polycarbonate, polyether, sulfonic acid-based material, silicon oxide (SiOx), etc., but is not limited thereto.

The panel 100 includes a display area DA including pixels that display an image and a non-display area NDA where an image is not displayed. In this case, the non-display area NDA may also be referred to as a bezel. The bezel tends to have a small width and thus may be very thin or absent.

The hole 111 may be formed in the non-display area NDA. Thus, a display device including an input button, a camera, a microphone, a speaker, a sensor module, a lighting module, an infrared module, a driving chip, and other input/output devices depending on the kind of the panel 100 may be implemented, but the present disclosure is not limited thereto. The hole 111 may be formed in the display area DA in addition to the non-display area NDA depending on a size or a position of the hole 111 so as to implement various functions.

Since the display device includes module devices having various functions, the weight and the thickness of the display device increase. Therefore, by forming a hole in the panel and installing a module device or an input button in the hole, it is possible to provide a thin display device with a reduced bezel size.

In order to form the hole 111, the substrate processing apparatus 200 may be disposed at a desired position for the hole 111 from among four lateral surfaces of the first substrate 110 and may grind the first substrate 110 while moving toward the center of the first substrate 110, i.e., in a direction D. Therefore, the hole 111 may be formed. As noted, the hole 111 may also be referred to as a recess. The substrate processing apparatus 200 may also move from side to side depending on a size or a shape of the hole 111 so as to form the hole 111 into a desired size and shape. In this case, the hole 111 may be positioned in a central portion of a side which constitutes the first substrate 110 and is not overlapped with the second substrate 120, as illustrated in FIG. 1, but is not limited thereto. The hole 111 may be formed in any position including a left or right corner of the first substrate 110. Also, the hole may be formed in a side where the first substrate 110 and the second substrate 120 are overlapped.

FIG. 2A through FIG. 2F are diagrams illustrating various embodiments of a hole formed in a substrate.

The hole 111 is disposed in a non-display area NDA of the first substrate 110 and has a shape in which the edge of the first substrate 110 is dented to form a recess. For example, in this embodiment, a part of the hole 111 is included in the edge or the periphery of the first substrate 110 and is thus a recess along the edge.

Figure 2A:
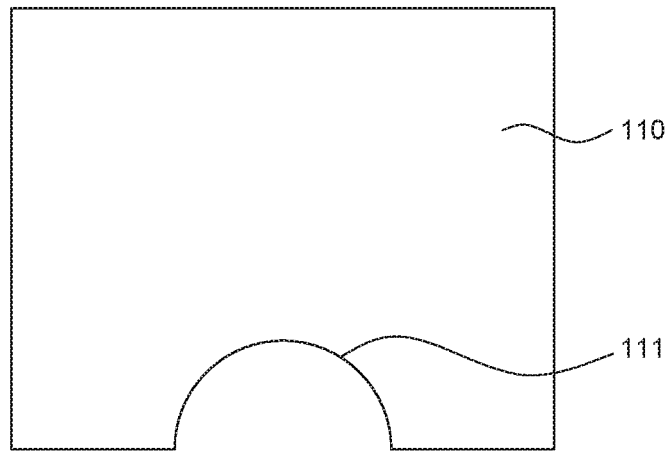
FIG. 2A through FIG. 2F are diagrams illustrating various embodiments of a hole formed in a substrate.
Figure 2B:
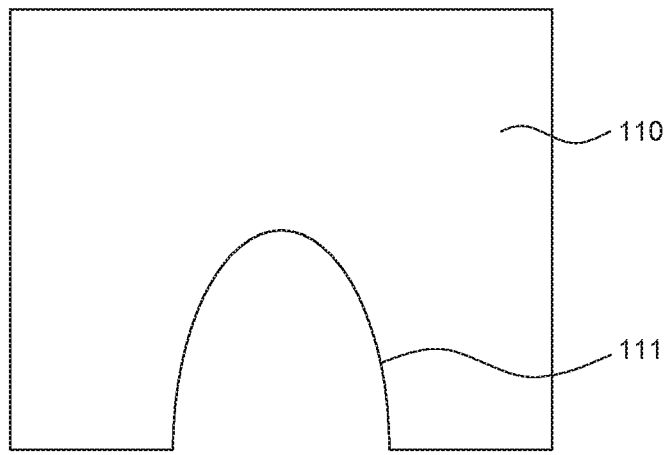
Figure 2C:
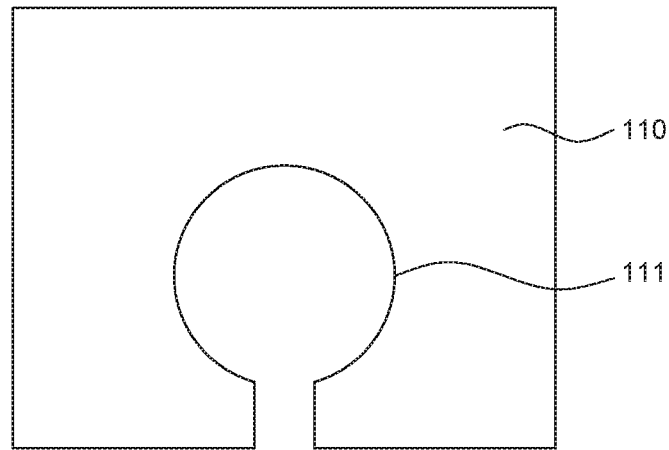
Figure 2D:
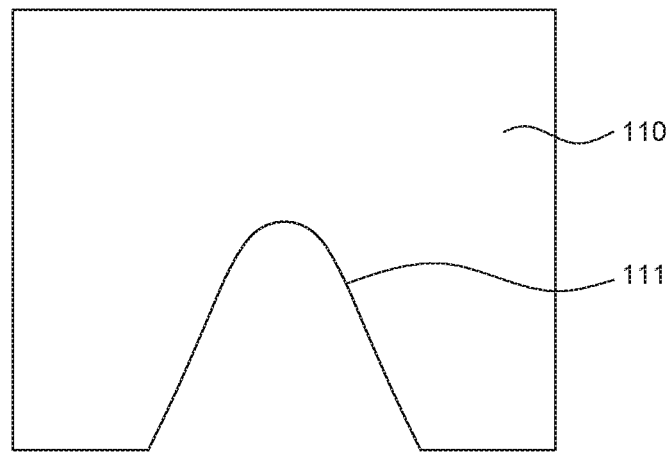
Figure 2E:
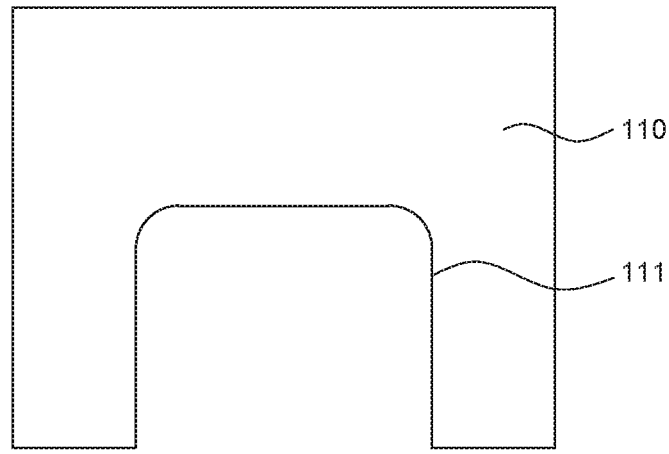
Figure 2F:
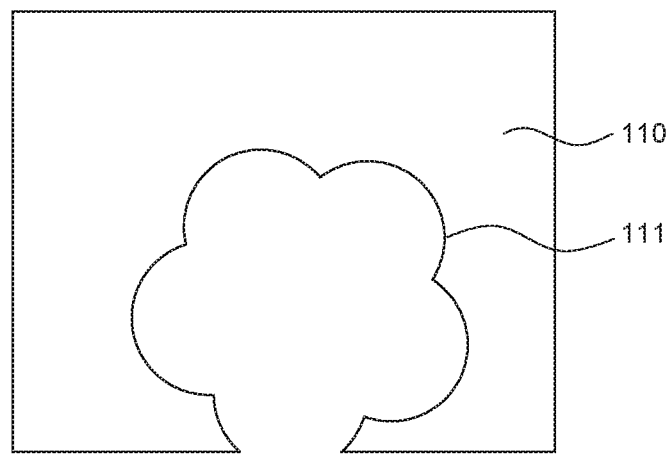

FIG. 2A is a diagram illustrating a semicircular hole. FIG. 2B is a diagram illustrating a semielliptical hole. FIG. 2C is a diagram illustrating a circular hole with one side open. FIG. 2D is a diagram illustrating a triangular hole with a round corner. FIG. 2E is a diagram illustrating a tetragonal hole with round corners. FIG. 2F is a diagram illustrating a flower-shaped hole. Also, the hole 111 may have a shape formed by connecting the holes illustrated in FIG. 2A through FIG. 2F. Otherwise, the hole 111 can be implemented in various shapes which can be formed by being ground with the substrate processing apparatus 200.

Figure 3:
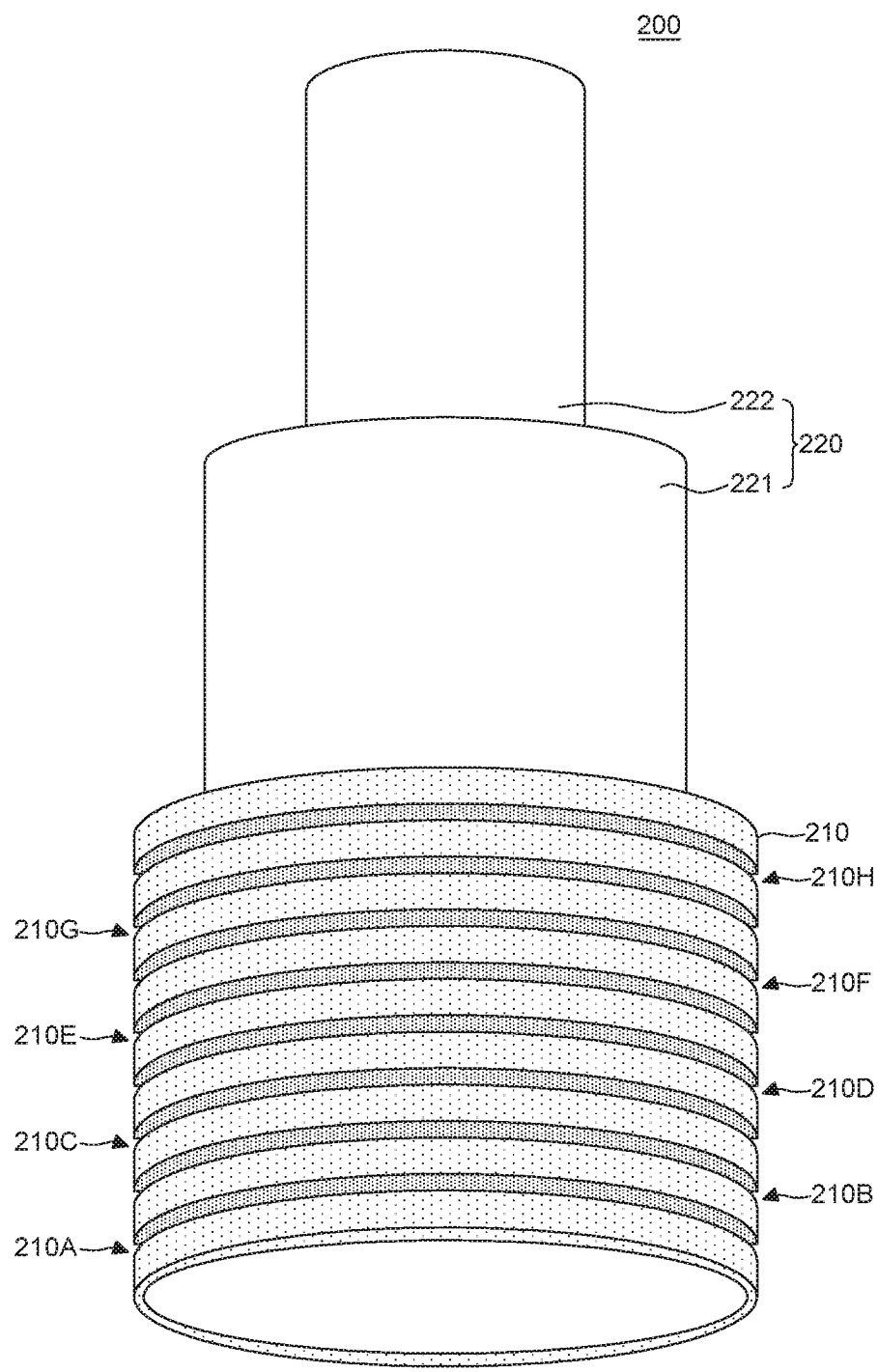
FIG. 3 is a diagram illustrating a substrate processing apparatus for forming a hole in a substrate.

FIG. 3 is a diagram illustrating a substrate processing apparatus 200 for forming a hole in a substrate. The substrate processing apparatus 200 may include a grinding part 210 and a body 220. The body 220 may include a first body 221 and a second body 222. The second body 222 is configured to be coupled to a rotating motor. The second body 222 coupled to the rotating motor transfers a force for rotating the substrate processing apparatus 200 at a high speed from the motor. The first body 221 is coupled to the second body 222 and configured to be rotatable. The first body 221 couples the second body 222 with the grinding part 210. The grinding part 210 is a portion in physical contact with, for example, a substrate to be ground. The grinding part 210 may have a cylindrical shape to reduce unnecessary force except a force for rubbing or touching and grinding the substrate via rotation, but is not limited thereto. The grinding part 210 may have any shape as long as it has a circular cutting plane cut along a direction substantially perpendicular to a rotation axis. In this case, the grinding part 210 may also be referred to as a grinding apparatus.

A lateral groove 210A may be formed in a surface of the grinding part 210 along the surface of the grinding part 210. If a hole is formed in a single substrate, the lateral groove 210A may be formed to have a thickness sufficient to accommodate the single substrate. If a hole is formed in a portion where two substrates are overlapped, the lateral groove 210A may be formed to have a thickness sufficient to accommodate the two substrates.

If the substrate is to accommodate a button having a size that varies depending on a thickness and a size of the substrate but is disposed on a mobile or tablet PC and is sufficient for a finger, for example an index finger, to touch it, a single lateral groove 210A may form a hole in a large number of substrates, for example about 200 to 300 substrates before being worn out. The lateral groove 210A has a lifetime of use for repeated forming of holes, which varies depending on shapes and durability of the lateral groove 210A and the type of substrate. The substrate processing apparatus 200 which has reached the end of its lifetime should be separated from the motor and replaced with a new substrate processing apparatus. The number of times of separating and replacing the substrate processing apparatus 200 affects processing time and cost. Each time the apparatus 200 is replaced there is time required to perform the replacement and cost of a new apparatus. Therefore, a plurality of lateral grooves 210A, 210B, 210C, 210D, 210E, 210F, 210G, and 210H are formed in the grinding part 210. Thus, it is possible to extend a lifetime of a single substrate processing apparatus 200 and also possible to reduce processing time and cost. For example, as illustrated in the drawings, if eight lateral grooves are formed, a hole may be formed in about 1600 to 2400 different substrates and then the substrate processing apparatus 200 may be replaced.

The substrate processing apparatus 200 may be formed of an alloy of copper (Cu) and tin (Sn) and then plated with cobalt (Co) having excellent oxidation resistance, corrosion resistance, abrasion resistance, and mechanical properties at a high temperature. A surface of the grinding part 210 that grinds a substrate via contact with the substrate may be plated with a diamond. Thus, the strength of the surface of the grinding part 210 and the lateral groove 210A can be enhanced. In this case, the grinding part 210 may be used for scribing and grinding a substrate and may also be referred to a grinder or a grinding wheel.

Figure 4:
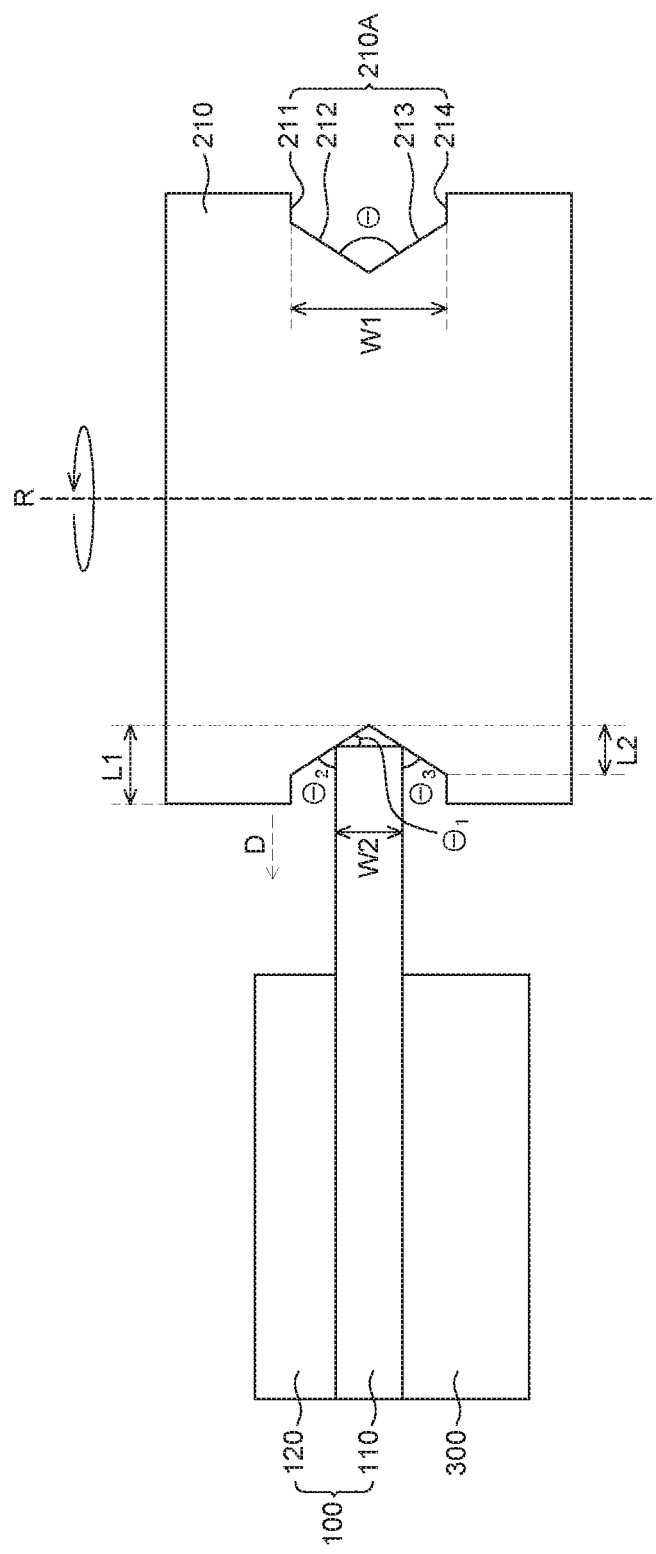
FIG. 4 is a cross-sectional view illustrating a substrate positioned on a stage to form a hole in the substrate and a grinding part including a lateral groove of a substrate processing apparatus according to a first embodiment of the present disclosure and positioned on an edge of the substrate.

FIG. 4 is a cross-sectional view illustrating a substrate positioned on a stage 300 to form a hole in the substrate and the grinding part 210 including the lateral groove 210A of the substrate processing apparatus 200 according to a first embodiment of the present disclosure and positioned on an edge or a periphery of the substrate.

The panel 100 of which the first substrate 110 is positioned on the lower side and the second substrate 120 is positioned on the upper side is fixed on the stage 300. In this case, an end portion of the second substrate 120 and an end portion of the stage 300 are aligned on the same line. Otherwise, the end portion of the second substrate 120 may be fixed as being protruded to the outside of the end portion of the stage 300. In order for the lateral groove 210A to accommodate the first substrate 110 therein, the lateral groove 210A may be formed to have a thickness W1 greater than a thickness W2 of the first substrate 110. The first substrate 110 may have various thicknesses depending on the kind of the panel 100. For example, the first substrate 110 may have a thickness of from about 0.10 mm to about 0.50 mm. In one embodiment, the thickness W1 of the lateral groove 210A is approximately 1.5 times greater than the thickness of the first substrate 110, but is not limited thereto.

As for the first substrate 110 accommodated in the lateral groove 210A, the grinding part 210 may move toward the substrate, i.e., in a direction D, while grinding a lateral surface and a corner of the first substrate 110 via rotation around a rotation axis R at a high speed.

If the grinding part 210 keeps moving in the direction D while grinding the lateral surface and the corner of the first substrate 110, there may be interference between the grinding part 210 and the second substrate 120 (e.g., the grinding part 210 may contact the second substrate 120) or between the grinding part 210 and the stage 300 (e.g., the grinding part 210 may contact the stage 300). For example, a depth L1 of the lateral groove 210A is affected by a size of the hole 111 and a shortest distance between the hole 111 and the second substrate 120. In one embodiment, referring to FIG. 1, the depth L1 of the lateral groove 210A is designed to be smaller than a shortest distance S between the hole 111 and the second substrate 120.

If the second substrate 120 is disposed on an inner side of the stage 300 (i.e., positioned further away from the grinding part 210 than the stage 300) rather than on the end portion of the stage 300 as shown in FIG. 4, the depth L1 of the lateral groove 210A may be designed to be smaller than a shortest distance between the hole 111 and the stage 300.

Therefore, a shortest distance from a hole formed in an edge or a periphery of a substrate (e.g., the first substrate 110) to a substrate or stage in which the hole is not formed (e.g., the second substrate 120 or the stage 300) is set to be greater than a depth of a lateral groove (e.g., depth L1) of the grinding part 210. Thus, it is possible to form the hole to the depths of the substrate without interference between the grinding part 210 and the substrate, or between the grinding part 210 and the stage 300. Even if the shortest distance S is reduced by reducing a bezel size of the display device, a hole can be formed.

The lateral groove 210A includes a total of four surfaces, i.e., a first surface 211, a second surface 212, a third surface 213, and a fourth surface 214. The first surface 211 and the fourth surface 214 are disposed substantially parallel to each other in a direction substantially perpendicular to the rotation axis R. The second surface 212 and the third surface 213 are extended from the first surface 211 and the fourth surface 214, respectively, and then meet each other at a predetermined angle θ. When the first substrate 110 is ground, the lateral groove 210A covers an upper surface and a lower surface of the first substrate 110, and the first surface 211 and the fourth surface 214 form a curve of the lateral groove 210A. Therefore, the first surface 211 and the fourth surface 214 may give stability in accommodating the first substrate 110 in the center of the lateral groove 210A.

The angle θ formed by the second surface 212 and the third surface 213 may have a designed value by adjusting a depth L2 of the second surface 212 and the third surface 213 and the width W1 of the lateral groove 210A. The grinding part 210 impacts to the first substrate 110 while grinding the first substrate 110. In order for the first substrate 110 to withstand the impacts, the depth L2 of the second surface 212 and the third surface 213 is adjusted and the depth L2 of the second surface 212 and the third surface 213 varies depending on the thickness W2 of the first substrate 110. For example, when the first substrate 110 has a thickness of 175 μm, the depth L2 of the second surface 212 and the third surface 213 may be 100 μm±60 μm.

In one embodiment, the angle θ formed by the second surface 212 and the third surface 213 is within a range from 40° or more to 90° or less.

If the angle θ is less than 40°, a distance between the first and fourth surfaces 211 and 214 and the first substrate 110 is reduced as compared with a case where the angle θ is equal to or more than 40°. Also, the first substrate 110 is accommodated deeper inside the lateral groove 210A. Therefore, interference between the grinding part 210 and the second substrate 120 may easily occur. Thus, the display device including the panel 100 may be damaged. And, an angle $θ_2$ formed by the second surface 212 and the upper surface of the first substrate 110 and an angle $θ_3$ formed by the third surface 213 and the lower surface of the first substrate 110 are smaller than an angle $θ_1$ formed by the second surface 212 or the third surface 213 and a lateral surface of the first substrate 110. Therefore, the upper surface and the lower surface of the first substrate 110 are mainly ground. Accordingly, a grinding speed of the first substrate 110 may be decreased and there may be limitation on reduction of the shortest distance S between the hole 111 and the second substrate 120.

If the angle θ is more than 90°, the angle $θ_2$ formed by the second surface 212 of the lateral groove 210A and the upper surface of the first substrate 110 and the angle $θ_3$ formed by the third surface 213 of the lateral groove 210A and the lower surface of the first substrate 110 are greater than the angle $θ_1$ formed by the second surface 212 or the third surface 213 and the lateral surface of the first substrate 110 as compared with a case where the angle θ is equal to or less than 90°. Therefore, the lateral surface of the first substrate 110 is mainly ground. Accordingly, the lateral groove 210A is easily worn down. Therefore, the angle θ of the lateral groove 210A becomes an blunt angle more rapidly. Thus, a lifetime of a single lateral groove 210A is reduced. As described above, if the angle θ of the single lateral groove 210A is within a range from 40° or more to 90° or less, a hole may be formed in about 200 to 300 substrates depending on the material of the substrate and other factors. If the angle θ of the single lateral groove 210A is more than 90°, a hole may be formed in about 100 substrates.

Therefore, in one embodiment, the angle θ formed by the second surface 212 and the third surface 213 of the lateral groove 210A is set to within a range from 40° or more to 90° or less. Thus, it is possible to reduce the shortest distance S between the hole 111 and the second substrate 120 and maximize a lifetime of the grinding part 210.

The depth L1 of the lateral groove 210A may be reduced by increasing the angle θ of the lateral groove 210A in the range of 40° or more to 90° or less. Since the hole 111 is formed by a scribing and/or grinding process, a tolerance margin for the scribing and/or grinding process is desired. For example, a margin of about 160 μm is used to reduce interference between the grinding part 210 and the second substrate 120. Therefore, in order to secure a margin and freedom in design of a size and a position of the hole 111, the depth L1 of the lateral groove 210A should be reduced. For example, if the angle θ is increased by 20° while the width W1 of the lateral groove 210A is maintained, the depth L1 of the lateral groove 210A can be reduced by 110 μm.

By increasing the angle θ of the lateral groove 210A, the depth L1 of the lateral groove 210A can be reduced and a margin between the hole 111 and the second substrate 120 can be secured, and, thus, it is possible to reduce interference. And, by increasing the angle θ of the lateral groove 210A to secure a margin between the second substrate 120 and the grinding part 210 for forming the hole 111, the hole 111 can be formed deep inside the second substrate 120. Therefore, it is possible to provide a display device with a narrow bezel. In other words, a position of the hole 111 in a display device with a narrow bezel may be closer to the second substrate 120 than a position of the hole in a display device without a narrow bezel. Therefore, by reducing the depth L1 of the lateral groove 210A of the grinding part 210 and thus reducing interference between the grinding part 210 and the second substrate 120, the hole 111 can be formed closer to the second substrate 120. Herein, the angle θ of the lateral groove 210A may be increased to reduce the depth L1 of the lateral groove 210A.

Figure 5:
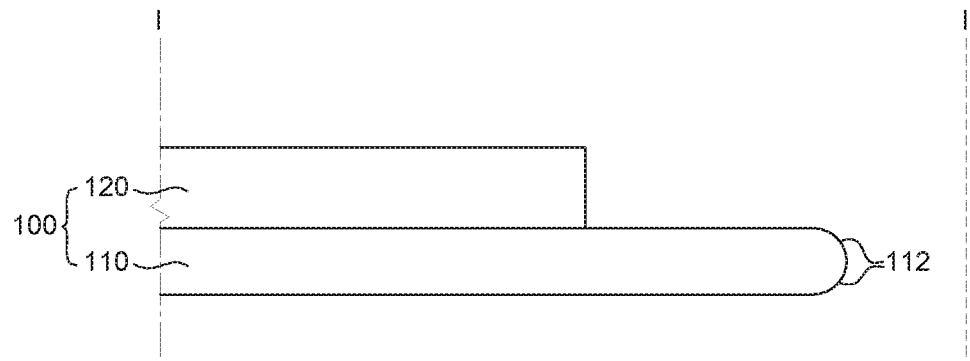
FIG. 5 is a cross-sectional view illustrating a cutting plane taken along a line I-I' of FIG. 1.

FIG. 5 is a cross-sectional view illustrating a cutting plane taken along a line I-I' of FIG. 1.

FIG. 5 is a cross-sectional view of the first substrate 110 in which the hole 111 is formed by being ground with the grinding part 210 and the second substrate 120. Since the lateral groove 210A has the predetermined angle θ, a corner 112 of the first substrate 110 is not angular, but is ground into a round shape. A substrate including a hole with an angular corner has a lower strength than a substrate including the hole 111 with the non-angular corner 112. For example, the substrate may have a strength of about 110 Mpa or more. Therefore, the hole with the angular corner may collide with the device during a grinding process or fragments of the substrate may be separated from the corner during a washing process, and, thus, grooves may be highly likely to be formed. The grooves unintendedly formed as such may have various sizes. If the grooves have a size equal to or greater than a predetermined size, they can be seen with the naked eye, resulting in a defective product. For example, when the grooves have a size of about 50 μm or less, a product can be of good quality.

Also, the ground hole 111 of the first substrate 110 should have a low roughness. The roughness refers to an average value calculated by measuring curves of a substrate at about 10 places or 10 portions of the substrate. A substrate with a lower roughness may be less damaged by impacts which may be applied to the substrate during a process. For example, the substrate may have a roughness of about 25 μm or less.

By forming the predetermined angle θ at the lateral groove 210A and grinding the corner 112 of the first substrate 110 into a round shape, the first substrate 110 can absorb impacts which may be generated during further processing. Therefore, it is possible to reduce the generation of grooves caused by separation of fragments of the substrate from the corner of the hole.

Figure 6:
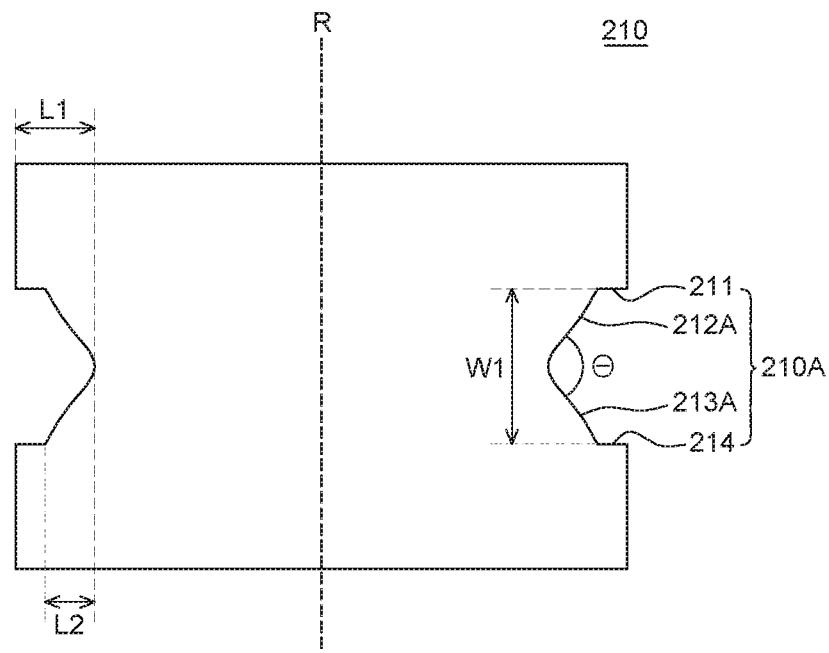
FIG. 6 is a cross-sectional view illustrating a shape of a lateral groove of a substrate processing apparatus according to a second embodiment of the present disclosure.

FIG. 6 is a cross-sectional view illustrating a shape of a lateral groove of a substrate processing apparatus according to a second embodiment of the present disclosure. The second embodiment may include components identical to those explained above in the first embodiment, and a redundant explanation thereof will be omitted. The design of the depth L1 and the width W1 of the lateral groove 210A explained in the first embodiment may be identically applied.

The lateral groove 210A includes a total of four surfaces, i.e., the first surface 211, a second surface 212A, a third surface 213A, and the fourth surface 214. The first surface 211 and the fourth surface 214 are disposed parallel to each other in the direction perpendicular to the rotation axis R. The second surface 212A and the third surface 213A are extended from the first surface 211 and the fourth surface 214, respectively, and then meet each other at a predetermined angle θ. In this case, the second surface 212A and the third surface 213A may form a curved surface. The angle θ may have a designed value by adjusting the depth L2 of the second surface 212A and the third surface 213A and the width W1 of the lateral groove 210A. In this case, the angle θ may be within a range from 40° or more to 90° or less in the same manner as the first embodiment with the same reason and the same effect.

Figure 7:
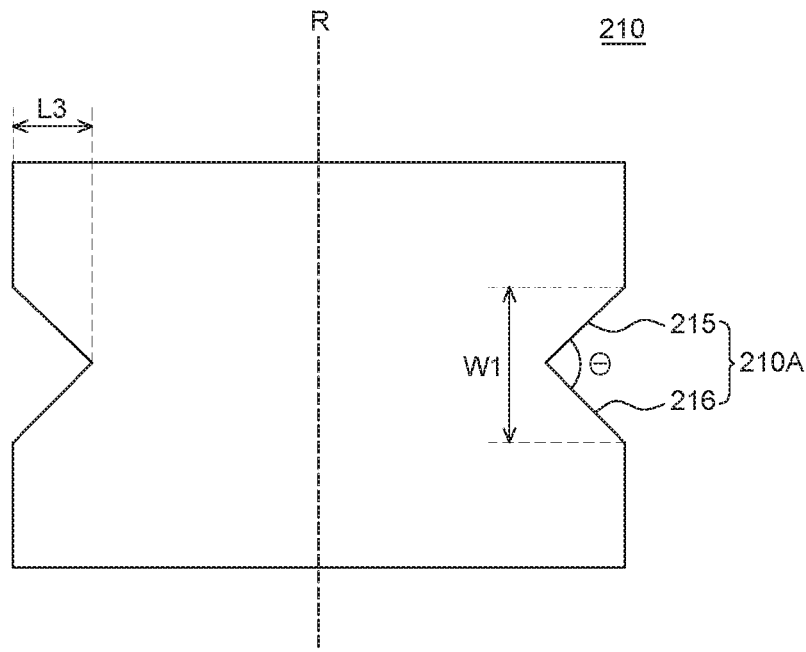
FIG. 7 is a cross-sectional view illustrating a shape of a lateral groove of a substrate processing apparatus according to a third embodiment of the present disclosure.

FIG. 7 is a cross-sectional view illustrating a shape of a lateral groove of a substrate processing apparatus according to a third embodiment of the present disclosure. The third embodiment may include components identical to those explained above in the first or second embodiment, and a redundant explanation thereof will be omitted or briefly provided.

Unlike the above-described first and second embodiments, the lateral groove 210A of the third embodiment includes a total of two surfaces, i.e., a second surface 215 and a third surface 216. In order for the second surface 215 and the third surface 216 to form the same angle θ and the same depth as those of the first or second embodiment without the first surface 211 and the fourth surface 214 which are the components of the first and second embodiments, the width W1 of the lateral groove 210A is increased. Otherwise, in order to form the same angle θ and the same width W1 as those of the first or second embodiment, a depth L3 of the lateral groove 210A is decreased. If the depth L3 of the lateral groove 210A is decreased, a range in which interference between the grinding part 210 and the second substrate 120 does not occur may be increased. The shortest distance S between the hole 111 and the second substrate 120 can be designed to be smaller. Therefore, a design margin of the hole 111 can be secured, and, thus, the hole 111 can be formed to be greater in size.

The angle θ may have a designed value by adjusting the depth L3 and the width W1 of the lateral groove 210A. In this case, the angle θ may be within a range from 40° or more to 90° or less in the same manner as the first or second embodiment with the same reason and the same effect.

Figure 8:
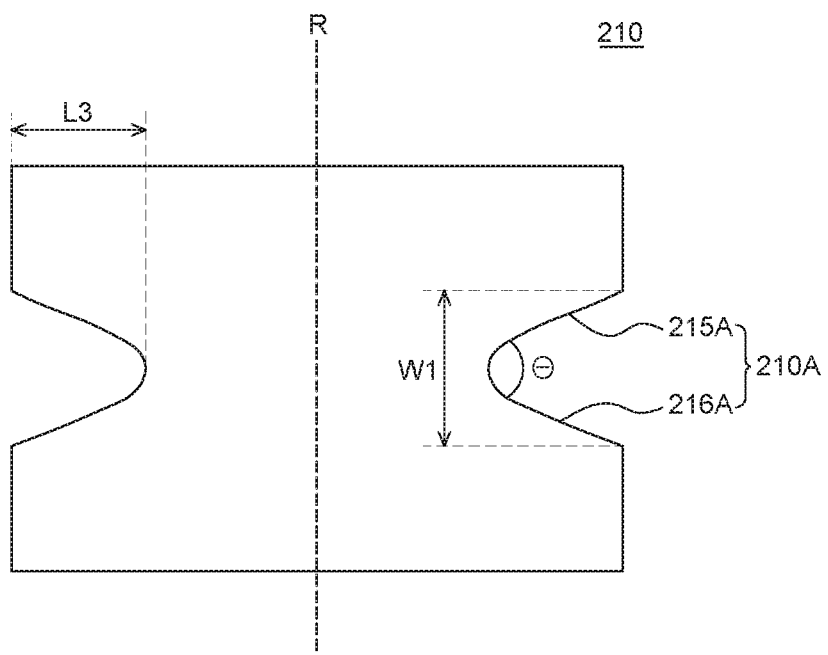
FIG. 8 is a cross-sectional view illustrating a shape of a lateral groove of a substrate processing apparatus according to a fourth embodiment of the present disclosure.

FIG. 8 is a cross-sectional view illustrating a shape of a lateral groove of a substrate processing apparatus according to a fourth embodiment of the present disclosure. The fourth embodiment may include components identical to those explained above in the third embodiment, and a redundant explanation thereof will be omitted or briefly provided. The design of the depth L3 and the width W1 of the lateral groove 210A explained in the third embodiment may be identically applied.

The lateral groove 210A includes a total of two surfaces, i.e., a second surface 215A and a third surface 216A in the same manner as the above-described third embodiment. The second surface 215A and the third surface 216A meet each other at a predetermined angle θ. In this case, the second surface 215A and the third surface 216A may form a curved surface.

The angle θ may have a designed value by adjusting the depth L3 and the width W1 of the lateral groove 210A. In this case, the angle θ may be 40° or more to 90° or less in the same manner as the third embodiment with the same reason and the same effect.

The embodiments of the present disclosure can also be described as follows:

According to an embodiment of the present disclosure, there is provided an apparatus comprising a body which, in operation, rotates, a cylindrical grinding part connected to the body, and a lateral groove located in a surface of the cylindrical grinding part, the lateral groove accommodating a display substrate for processing thereof. Thus, it is possible to form a hole by grinding an edge of a substrate so as to be matched with a designed value.

According to one or more embodiments of the present disclosure, a height of the lateral groove may be greater than a thickness of the substrate.

According to one or more embodiments of the present disclosure, the apparatus further may comprise a plurality of lateral grooves formed in the surface of the cylindrical grinding part such that display substrates to be processed can be accommodated in another lateral groove in case a particular lateral groove becomes unsuitable for processing.

According to one or more embodiments of the present disclosure, the surface of the cylindrical grinding part may be plated with diamond or diamond-like material.

According to one or more embodiments of the present disclosure, the lateral groove may include four surfaces in a cutting groove positioned around a rotation axis of the cylindrical grinding part.

According to one or more embodiments of the present disclosure, a first surface and a second surface of the four surfaces may be substantially parallel to each other in a direction substantially perpendicular to the rotation axis and a third surface and a fourth surface of the four surfaces may meet each other to form an angle therebetween. And the angle may be within a range from 40° to 90°.

According to one or more embodiments of the present disclosure, a first surface and a second surface of the four surfaces may be substantially parallel to each other in a direction substantially perpendicular to the rotation axis and a third surface and a fourth surface of the four surfaces may meet each other at a curved surface having an angle. And the angle may be within a range from 40° to 90°.

According to another embodiment of the present disclosure, there is provided a substrate processing apparatus for forming a hole at a periphery of a substrate, comprising a body coupled to a rotating motor, and a grinding part coupled to the body, the grinding part including a lateral groove along a lateral surface of the grinding part, the lateral groove including two surfaces in a cutting plane positioned along a rotation axis of the grinding part. Thus, it is possible to form a hole by grinding the edge of the substrate so as to be matched with a designed value.

According to one or more embodiments of the present disclosure, the cutting plane of the grinding part may have a circular shape along a direction substantially perpendicular to the rotation axis of the grinding part.

According to one or more embodiments of the present disclosure, a height of the lateral groove may be greater than a thickness of the substrate.

According to one or more embodiments of the present disclosure, the substrate processing apparatus further may comprise a plurality of lateral grooves along the lateral surface of the grinding part such that display substrates to be processed can be accommodated in another groove in case a particular groove becomes unsuitable for processing.

According to one or more embodiments of the present disclosure, the two surfaces of the groove may be formed at an angle within a range from 40° to 90°.

According to one or more embodiments of the present disclosure, the two surfaces may form a curved surface and the two surfaces of the groove may be disposed at an angle within a range from 40° to 90°.

According to another embodiment of the present disclosure, there is provided a display device comprising a first substrate, a second substrate on the first substrate, and an opening disposed in a periphery of the first substrate. The opening is exposed by the second substrate. And the opening has a configuration resulting from a cylindrical grinding apparatus having a lateral groove. Thus, it is possible to provide a thin display device with a reduced bezel size by installing a module or an input button in the ground hole.

According to one or more embodiments of the present disclosure, a shortest distance from the opening to the second substrate may be greater than a depth of the lateral groove of the cylindrical grinding apparatus.

According to one or more embodiments of the present disclosure, a corner of the opening may have a round shape.

According to one or more embodiments of the present disclosure, the display device may further include an input button accommodated in the opening.

Although the embodiments of the present disclosure have been described in detail with reference to the accompanying drawings, the present disclosure is not limited thereto and may be embodied in many different forms without departing from the technical concept of the present disclosure. Therefore, the embodiments of the present disclosure are provided for illustrative purposes but not intended to limit the technical concept of the present disclosure. The scope of the technical concept of the present disclosure is not limited thereto. Therefore, it should be understood that the above-described embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An apparatus for processing a display substrate, comprising:
   a body which, in operation, rotates;
   a cylindrical grinding part connected to the body, the cylindrical grinding part configured to rotate along a rotation axis; and
   a lateral groove located in a surface of the cylindrical grinding part, the lateral groove accommodating the display substrate for processing thereof,
   wherein the lateral groove includes four surfaces in a cutting groove positioned around the rotation axis of the cylindrical grinding part, and
   wherein a first surface and a second surface of the four surfaces are substantially parallel to each other in a direction substantially perpendicular to the rotation axis and a third surface and a fourth surface of the four surfaces meet each other to form an angle therebetween.

2. The apparatus according to claim 1 wherein a height of the lateral groove is greater than a thickness of the substrate.

3. The apparatus according to claim 1, further comprising:
   a plurality of lateral grooves formed in the surface of the cylindrical grinding part such that display substrates to be processed can be accommodated in another lateral groove in case a particular lateral groove becomes unsuitable for processing.

4. The apparatus according to claim 1 wherein the surface of the cylindrical grinding part is plated with diamond or diamond-like material.

5. The apparatus according to claim 1 wherein the angle is within a range from 40° to 90°.

6. The apparatus according to claim 1 wherein the third surface and the fourth surface of the four surfaces meet each other at a curved surface having an angle.

7. The apparatus according to claim 6 wherein the angle is within a range from 40° to 90°.

8. The apparatus according to claim 1, wherein the display substrate includes a first substrate and a second substrate, and the first substrate includes a driving element that drives a pixel and the second substrate is disposed on the first substrate.

9. The apparatus according to claim 8, wherein the cylindrical grinding part is kept at a constant distance from the second substrate without interference with each other when the cylindrical grinding part forms a hole in the first substrate.

* * * * *